United States Patent
Tanaka

(10) Patent No.: US 9,615,121 B2
(45) Date of Patent: Apr. 4, 2017

(54) BROADCAST RECEIVER AND TUNING APPARATUS

(71) Applicant: Funai Electric Co., Ltd., Osaka (JP)

(72) Inventor: Yoshiki Tanaka, Osaka (JP)

(73) Assignee: Funai Electric Co., Ltd., Osaka (JP)

( * ) Notice: Subject to any disclaimer, the term of this patent is extended or adjusted under 35 U.S.C. 154(b) by 0 days.

(21) Appl. No.: 14/806,164

(22) Filed: Jul. 22, 2015

(65) Prior Publication Data

US 2016/0029066 A1  Jan. 28, 2016

(30) Foreign Application Priority Data

Jul. 22, 2014 (JP) .................................. 2014-149102

(51) Int. Cl.

| H04N 5/50 | (2006.01) |
|---|---|
| H04N 7/16 | (2011.01) |
| H04N 21/426 | (2011.01) |
| H04B 1/00 | (2006.01) |
| H04N 5/455 | (2006.01) |
| H03J 1/00 | (2006.01) |
| H04N 21/438 | (2011.01) |
| H04H 40/00 | (2009.01) |
| H04H 40/18 | (2008.01) |

(52) U.S. Cl.
CPC ....... *H04N 21/4263* (2013.01); *H03J 1/0066* (2013.01); *H04B 1/006* (2013.01); *H04H 40/00* (2013.01); *H04N 5/455* (2013.01); *H04N 5/50* (2013.01); *H04N 21/42607* (2013.01); *H04N 21/4383* (2013.01); *H03J 2200/32* (2013.01); *H04H 40/18* (2013.01)

(58) Field of Classification Search
CPC ........................................................ H04N 5/50
USPC ......................................... 725/151; 348/731
See application file for complete search history.

(56) References Cited

U.S. PATENT DOCUMENTS

| 2004/0252196 A1* | 12/2004 | Englmeier ............. H04N 7/102 348/192 |
|---|---|---|
| 2009/0244397 A1* | 10/2009 | Aoki ................... H04L 27/0014 348/725 |
| 2010/0130158 A1 | 5/2010 | Khoini-Poorfard et al. |

FOREIGN PATENT DOCUMENTS

| DE | 4117239 A1 | 12/1992 |
|---|---|---|
| JP | 2001-359005 A | 12/2001 |
| WO | 03/092160 A1 | 11/2003 |
| WO | 2013/070548 A1 | 5/2013 |

OTHER PUBLICATIONS

Extended European Search Report issued in corresponding European Application No. 15177936.0 dated Sep. 29, 2015 (2 pages).

* cited by examiner

*Primary Examiner* — Dominic D Saltarelli
(74) *Attorney, Agent, or Firm* — Osha Liang LLP

(57) ABSTRACT

A broadcast receiver includes a processor that processes a broadcasting signal, a detector that detects a level of a signal of a first predetermined band of the broadcasting signal, and an adjuster that adjusts at least one of a characteristic and an operation of the processor based on the detected level.

12 Claims, 12 Drawing Sheets

JAPAN

57MHz  93MHz

U.S.

57MHz  93MHz

SIGNAL INPUT AT ONLY FREQUENCY OF 100 MHz FOR JAPAN

BROADCAST RECEIVER AND TUNING APPARATUS

TECHNICAL FIELD

The present invention generally relates to a broadcast receiver and a tuning apparatus.

BACKGROUND ART

Conventional high frequency circuits used for a digital television broadcasting signal, and the like, have been developed.

Here, the reception bands of the digital television broadcast may be different for the broadcast systems in each different region. For example, the center frequency of the lower limit channel for reception bands used in the U.S. is about 57 MHz. In contrast, the center frequency of the lower limit channel for reception bands used in Japan is about 93 MHz.

In this case, the cutoff frequency of a high pass filter in the high frequency circuit must be adjusted between the U.S. and Japan in order to efficiently suppress interfering signals below a lower limit channel. That is, it is necessary to use a separate design for each destination of the product.

CITATION LIST

Patent Literature

[Patent Literature 1] Japanese Unexamined Patent Application Publication No. 2001-359005

Here, in Patent Document 1, a high frequency circuit similar to the following is disclosed. During television broadcasting signal reception of a VHF (Very High Frequency) band, a low pass filter is formed creating a cutoff frequency between the frequencies of the VHF band and a UHF (Ultra High Frequency) band, the broadcasting signal of the UHF band is sufficiently attenuated, and the broadcasting signal of the VHF band is input to a VHF band circuit by switching a switch to a predetermined state. Further, during television broadcasting signal reception of the UHF band, a high pass filter is formed creating a cutoff frequency between the frequencies of the VHF band and the UHF band, the broadcasting signal of the VHF band is sufficiently attenuated, and the broadcasting signal of the UHF band is input to a UHF band circuit by switching a switch to a different predetermined state.

However, Patent Document 1 is intended to successfully receive each VHF or UHF broadcasting signal when both the broadcasting signal of the VHF band and the UHF band exist, and is not intended to resolve the problem of reception of broadcasting signals in reception bands, which differ in each region.

SUMMARY OF THE INVENTION

A broadcast receiver according to one or more embodiments of the present invention can correspond to reception bands in different regions without performing a design change. One example of a broadcast receiver is a high frequency circuit.

According to one or more embodiments of the present invention, a high frequency circuit may comprise a separator that separates an input high frequency signal into a plurality of output signals, a high frequency processor that performs a predetermined process on a first output signal of the separator, a band limiter that performs band limiting in a predetermined band on a second output signal of the separator, a detector that detects a signal output by the band limiter after band limiting, and an adjuster that adjusts a characteristic of the high frequency processor or an operation of a high frequency processor different from the high frequency processor described above based on the detection signal output by the detector.

According to this configuration, because the characteristic of the high frequency processor or the operation of the high frequency processor different from the high frequency processor described above is automatically adjusted depending on the reception bands, which are different in each region, there is no need to perform a design change for the destination of the product as performed conventionally.

Further, according to one or more embodiments of the present invention above, the characteristic of the high frequency processor may also be at least a characteristic of the filter or a characteristic of the impedance matching unit.

According to this configuration, it is possible to correspond to the reception bands, which differ in each region, to efficiently suppress an interfering signal, and/or to efficiently perform signal transmission.

Further, according to one or more embodiments of the present invention above, the high frequency circuit may comprise a plurality of band limiters and detectors, and the adjuster may output a control signal by a level corresponding to a combination of the level of each detection signal output by the plurality of detectors.

According to this configuration, it is possible to correspond to the reception bands of three or more different regions.

Further, according to one or more embodiments of the present invention above, the band limiter and the detector may be respectively provided in a plurality, the high frequency processor includes a plurality of filters, and each of the plurality of detectors outputs each detection signal to each of the plurality of filters included in the high frequency processor.

According to this configuration, an interfering signal can be efficiently suppressed depending on the presence or absence of each different reception channel of a frequency range.

Further, according to one or more embodiments of the present invention above, a signal amplifier arranged between an output of the band limiter and an input of the detector can also be further provided.

According to this configuration, the peak-to-peak level of the output signal of a band limiter, which is an AC signal, is amplified, and the DC level of a detection signal output by the detector may become highly adjustable.

According to one or more embodiments of the present invention, a broadcast receiver may comprise a processor that processes a broadcast signal, a detector that detects a level of a signal of a first predetermined band of the broadcast signal, and an adjuster that adjusts at least one of a characteristic and an operation of the processor based on the detected level.

According to one or more embodiments of the present invention, a tuning apparatus may comprise a processor that processes a broadcast signal, a detector that detects a level of a signal of a first predetermined band of the broadcast signal, and an adjuster that adjusts at least one of a characteristic and an operation of the processor based on the detected level.

The broadcast receiver according to one or more embodiments of the present invention can correspond to different regions of the reception bands without performing design changes.

DETAILED DESCRIPTION OF EMBODIMENTS

First Example

Figure 1:
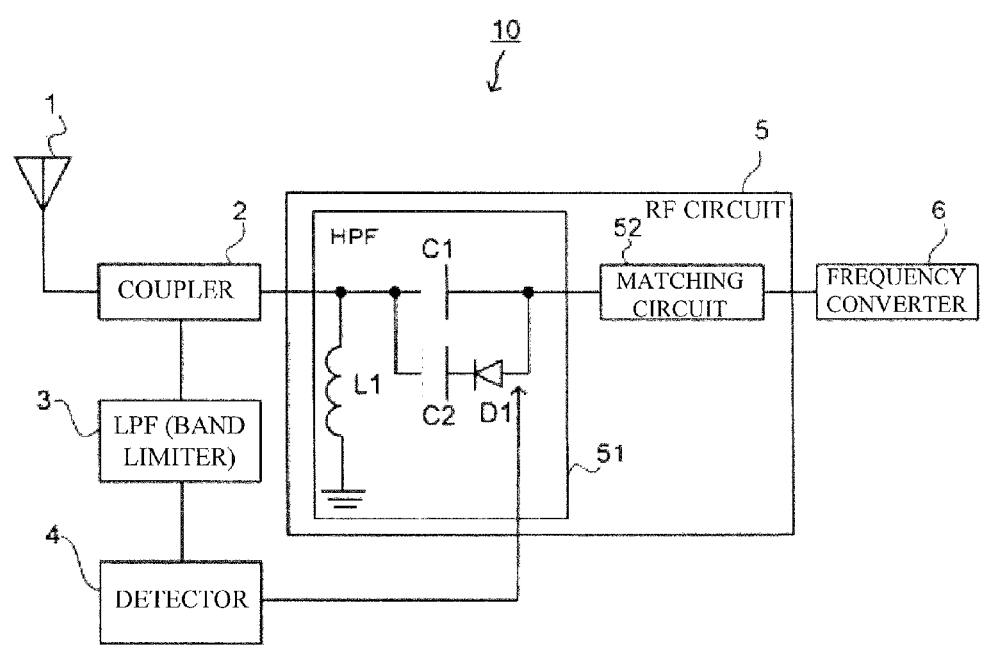
FIG. 1 is a schematic configuration of a high frequency circuit according to one or more embodiments of a first example of the present invention.

Embodiments of the present invention will be described below, with reference to the drawings. A schematic configuration of a broadcast receiver (e.g., high frequency circuit) according to one or more embodiments of a first example of the present invention is illustrated in FIG. 1. The high frequency circuit 10 illustrated in FIG. 1 is a circuit used in a digital television broadcasting signal, and may comprise a coupler 2, a low-pass filter (LPF) 3, a detector 4, a processor (e.g., an RF (radio frequency) circuit) 5, and a frequency converter 6. The high frequency circuit 10 is an example of a broadcast receiver or a tuning apparatus.

The coupler 2 outputs a high frequency signal (e.g., broadcasting signal) of a majority of the power to the RF circuit 5 out of a digital television broadcasting signal, which is a high frequency signal input from an antenna 1 connected externally, and outputs the high frequency signal, which has remaining very little power, to the LPF 3. That is, the coupler 2 functions as one example of a separator that separates an input high frequency signal into a plurality of output signals. It is not limited to broadcast reception by the antenna, a coaxial cable or an optical cable, and the like, may also be used for broadcast reception.

The RF circuit 5 may comprise a high pass filter (HPF) 51, and a matching circuit 52. The HPF 51 is composed of an inductor L1, a capacitor C1 connected to the inductor L1 in series, a capacitor C2 connected in parallel to a capacitor C1, and a PIN diode D1 connected to a capacitor C2 in series. The HPF 51 performs filtering that blocks a frequency signal below a cutoff frequency for a high frequency signal input from the coupler 2. The RF circuit 5 is an example of a processor that processes a broadcasting signal. The capacitor C2 and the PIN diode D1 may function as an adjuster of the RF circuit 5. The adjuster may adjust a capacity to determine a cutoff frequency.

The matching circuit 52 is disposed between the earlier stage HPF 51 and a later stage frequency converter 6, and is a circuit for matching impedance. The matching circuit 52, for example, is composed of an LC circuit, which has an inductor and a capacitor.

The frequency converter 6 performs frequency conversion for the high frequency signal input from the matching circuit 52 and outputs an intermediate frequency signal (the frequency converter 6 converts a frequency of a signal of a first predetermined band to a predetermined frequency of a second predetermined band). The output intermediate frequency signal is digitally demodulated by a later stage demodulation circuit, not illustrated.

The LPF 3 performs filtering that blocks a frequency signal above a cutoff frequency for the high frequency signal input from the coupler 2. That is, the LPF 3 functions as a band limiter. The detector 4 detects a level of the output signal of the LPF 3 (a level of a signal of a first predetermined band of the broadcasting signal) (the signal after band limiting), outputs a DC voltage signal and applies the DC voltage signal to the PIN diode D1 as a detection result.

Figure 2:
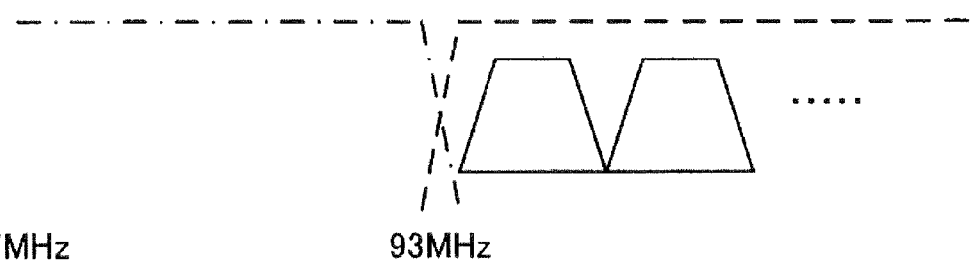
FIG. 2 is a figure schematically illustrating a channel existing in a reception band for digital television broadcasting in Japan and the U.S.
Figure 2:
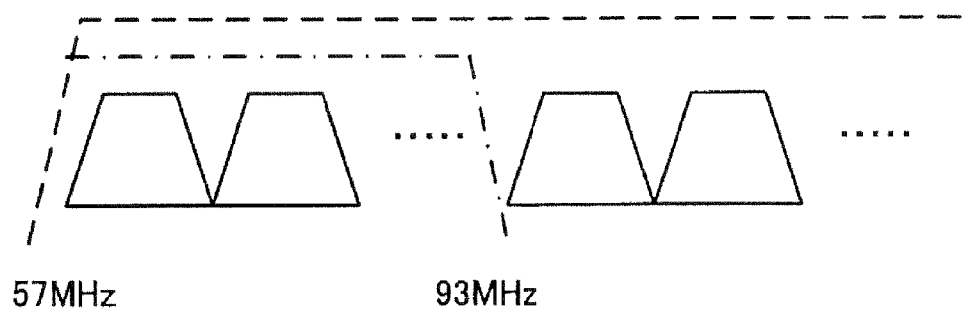

Here, the channels present in the reception bands for Japan are illustrated schematically in the upper part of FIG. 2, and the channels present in the reception bands for the U.S. are illustrated schematically in the lower part of FIG. 2, both of which are for the digital television broadcasting above. If made to correspond to this type of difference in reception bands for Japan and the U.S., the cutoff frequency of the LPF 3 will be set to about 93 MHz, which is the lower limit frequency for a reception band in Japan.

Because there is no broadcasting signal of a frequency less than 93 MHz in Japan, the DC voltage signal, which is the output of the detector 4, is nearly 0V (low level) as a result of the power detection, after band limiting by the LPF 3 with the filter characteristics illustrated by the dashed lines in the upper part of FIG. 2. Therefore, a voltage signal of substantially 0V is applied to the PIN diode D1, and the PIN diode D1 does not operate and becomes an open state. Therefore, the HPF 51 functions as a circuit composed of an inductor L1 and a capacitor C1, and the cutoff frequency is set to about 93 MHz, which is the lower limit frequency for a reception band in Japan. Therefore, because the HPF 51 filters the output of the coupler 2, with the filter characteristics illustrated by the dashed lines in the upper part of FIG. 2, an interfering wave of a frequency less than about 93 MHz can efficiently be suppressed.

In contrast, because there is a broadcasting signal in the frequencies from 57 MHz to 93 MHz in the U.S., the DC voltage signal, which is an output of the detector 4, is at a high level if the signal 4, after band limiting by the LPF 3 through the filter characteristics illustrated by the dashed lines in the lower part of FIG. 2, is detected. Therefore, the high level voltage signal is applied to the PIN diode D1, the PIN diode D1 operates and becomes a short circuit state, the HPF 51 functions as a circuit composed of the inductor L1 and the combined capacitance for the capacitor C1 and the capacitor C2, and the cutoff frequency is set at about 57 MHz, which is the lower limit frequency for a reception band in the U.S. Therefore, because the HPF 51 filters the output of the coupler 2, with the filter characteristics illustrated by the dashed lines in the lower part of FIG. 2, an interfering wave of a frequency less than about 57 MHz can efficiently be suppressed.

Thus, according to one or more embodiments of the present example, because characteristics of the HPF 51 are automatically and properly adjusted depending on the reception bands, which vary by region, it is unnecessary to change the design for each destination of the product as with the conventional technique.

As a modification of embodiments of the present invention, for example, the presence or absence of an upper limit channel for a reception band is determined by using an HPF as a band limiter instead of an LPF, and the LPF characteristics of the RF circuit may also be adjusted. Further, the presence or absence of channels within a specific band is determined by using a BPF (band pass filter) as a band limiter, and the characteristics the RF circuit may also be adjusted.

Second Example

Figure 3:
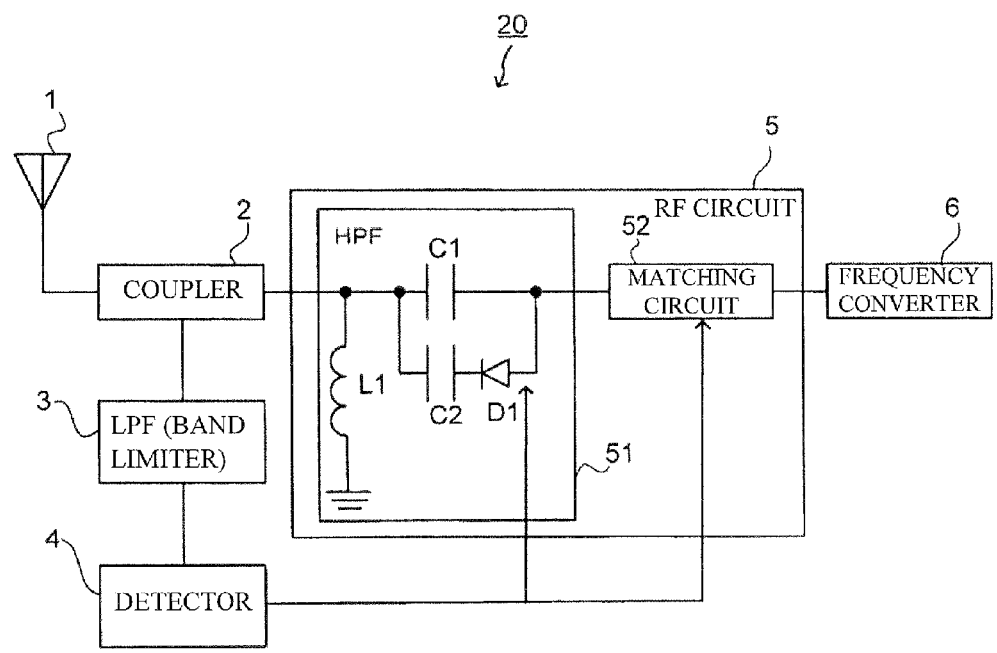
FIG. 3 is a schematic configuration of a high frequency circuit according to one or more embodiments of a second example of the present invention.

Next, embodiments of a second example of the present invention are described. A schematic configuration of a high frequency circuit according to one or more embodiments of the present example is illustrated in FIG. 3. The configuration of a high frequency circuit 20 illustrated in FIG. 3 may be the same as embodiments of the first example of the present invention (FIG. 1). The difference is that the output of the detector 4 is also input to the matching circuit 52 as well as the HPF 51.

If the matching circuit 52 is configured by, for example, the LC circuit, HPF 51 may comprise an inductor and a PIN diode D1 in addition to a capacitor. Further, a DC voltage signal output by the detector 4 is applied to the variable capacitance diode.

In this type of configuration, the PIN diode D1 is controlled through the level of the DC voltage signal output by the detector 4, and whether a capacitance component will only become a capacitor of a fixed capacity or become a combined capacitance of a capacitor of a fixed capacity and the PIN diode D1 is switched by the matching circuit 52. Thus, the impedance characteristic of the matching circuit 52 is switched. The capacitor C2 and the PIN diode D1 may function as an adjuster of the RF circuit 5.

Therefore, according one or more embodiments of the present example, characteristics of the matching circuit 52 are automatically adjusted depending on the reception bands, which vary by region, impedance matching can be performed properly, and signal transmission can be performed efficiently.

In FIG. 3, both the HPF 51 and the matching circuit 52 are adjusted by an output of the detector 4, but the matching circuit 52 may also be adjusted alone.

Third Example

Figure 4:
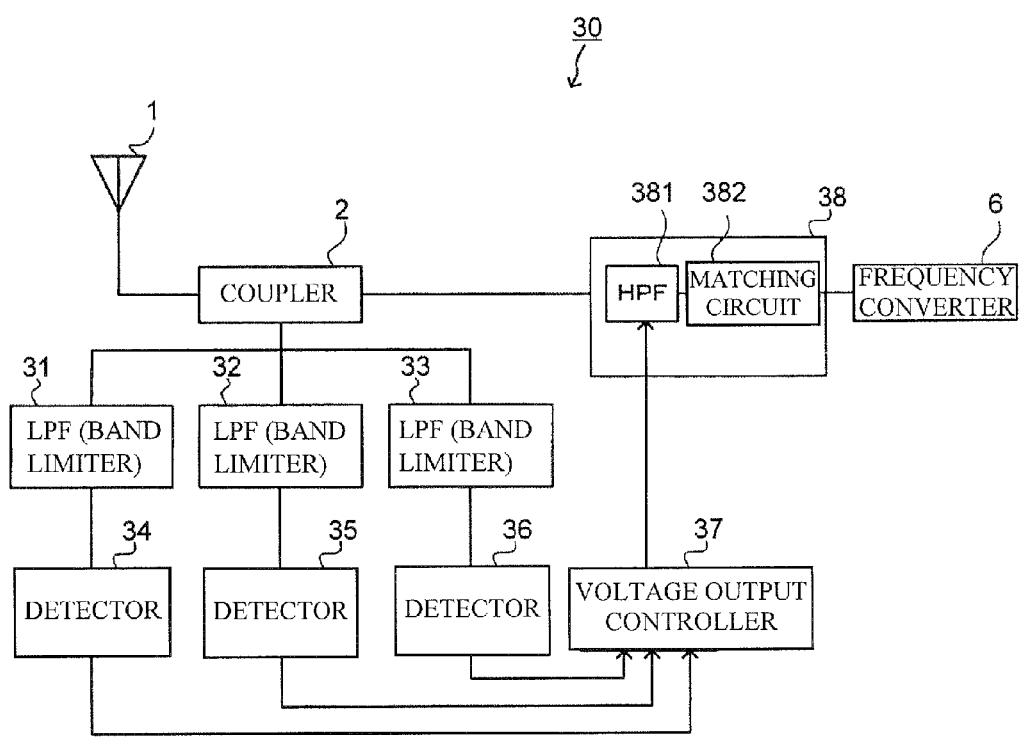
FIG. 4 is a schematic configuration of a high frequency circuit according to one or more embodiments of a third example of the present invention.

Next, embodiments of a third example of the present invention is described. A schematic configuration of a high frequency circuit according to one or more embodiments of the present example is illustrated in FIG. 4. In a high frequency circuit 30 illustrated in FIG. 4, a plurality of LPF 31 to 33, a plurality of detectors 34 to 36, a voltage output controller 37, and an RF circuit 38 are provided.

The coupler 2 separates the high frequency signal which has the low power from the high frequency signal input from the antenna 1 and outputs the separated high frequency signal to each LPF 31 to 33. The signal, after being filtered by each LPF 31 to 33, is detected by each detector 34 to 36. Each DC voltage signal, which is each detection result of each detector 34 to 36, is output to the voltage output controller 37. The voltage output controller 37 outputs a voltage control signal by a level corresponding to the combination of each input DC voltage signal. The voltage control signal is applied to the PIN diode (not illustrated) in an HPF 381 of the RF circuit 38.

Figure 5:
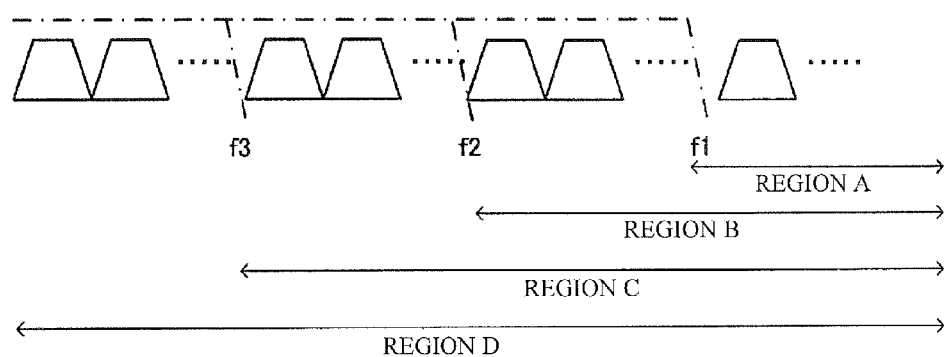
FIG. 5 is a figure schematically illustrating one example of a reception band for each region according to one or more embodiments of the third example of the present invention.

As illustrated in FIG. 5 for example, the lower limit frequency of a reception band in a region A is f1, the lower limit frequency of a reception band in a region B is f2, the lower limit frequency of a reception band in a region C is f3, and the lower limit frequency of a reception band in a region D is f4. In this case, the cutoff frequency of the LPF 33 is set to f1, the cutoff frequency of the LPF 32 is set to f2, and the cutoff frequency of the LPF 31 is set to f3.

Thus, for the high frequency circuit 30 installed in the region A, the DC voltage signal output together with the detectors 34 to 36 becomes nearly 0V (low level). Further, for the region B, the output of the detectors 34 and 35 becomes a low level, but the output of the detector 36 becomes a high level. Further, for the region C, the output of the detector 34 becomes a low level, but the output of the detectors 35 and 36 becomes a high level. Further, for the region D, the output of the detectors 34 to 36 becomes a high level together.

The voltage output controller 37 outputs a voltage control signal by a level corresponding to the combination of the output level of this kind of detector 34 to 36. For example, for the combination of output levels of the detectors corresponding to the region A, a voltage control signal of nearly 0V (low level) is output. Similarly, a first high level voltage control signal for the region B, a second high level voltage control signal for the region C (greater than the first high level), and a third high level voltage control signal (greater than the second high level) are each output.

Thus, the capacitance of the PIN diode in the HPF 381 (not illustrated) is controlled according to the level of the voltage control signal, and the cutoff frequency of the HPF 381 is adjusted. Therefore, proper adjustment to the characteristics of the HPF 381 according to the reception band of the region A to D, and efficient suppression of an interfering wave is possible.

Fourth Example

Figure 6:
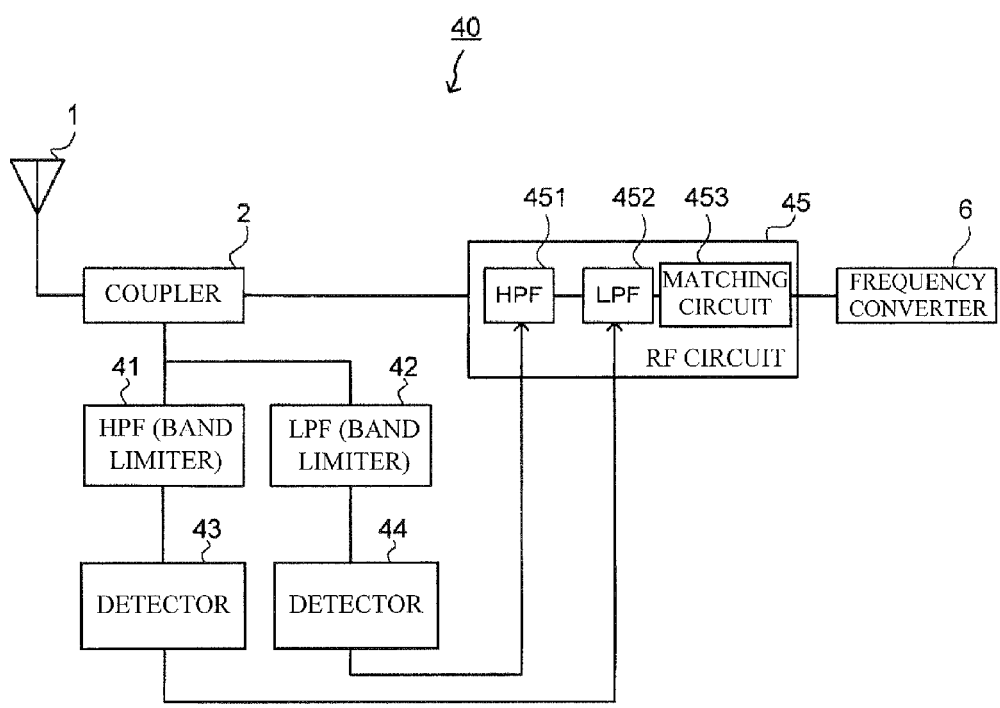
FIG. 6 is a schematic configuration of a high frequency circuit according to one or more embodiments of a fourth example of the present invention.

Next, embodiments of a fourth example of the present invention are described. A schematic configuration of a high frequency circuit according to one or more embodiments of the present example is illustrated in FIG. 6. In a high frequency circuit 40 illustrated in FIG. 6, an HPF 41 and an LPF 42 are provided as band limiters, and a detector 43, 44 corresponding to both the HPF 41 and the LPF 42, respectively, and an RF circuit 45 are further provided. In the RF circuit 45, an HPF 451, an LPF 452, and a matching circuit 453 from the early stage side are disposed in order.

The HPF 41 filters according to a low power, high frequency signal output from the coupler 2 by filter characteristics of a predetermined cutoff frequency, and the detector 43 detects the signal after band limiting by the HPF 451. And the detector 43 outputs a DC voltage signal as detection results to the LPF 452 of the RF circuit 45. By this, a DC voltage signal for a level corresponding to the presence or absence of an upper limit channel in the reception band is output from the detector 43, and the cutoff frequency for the LPF 452 is adjusted. The HPF 451 may function as an adjuster of the RF circuit 45.

Further, the LPF 42 performs a filtering process on a low power high frequency signal output from the coupler 2 by filter characteristics of a predetermined cutoff frequency, and the detector 44 detects the signal after band limiting by the LPF 42. The detector 44 outputs a DC voltage signal as detection results to the HPF 451 of the RF circuit 45. By this, a DC voltage signal for a level corresponding to the presence or absence of a lower limit channel in the reception band is output from the detector 44, and the cutoff frequency for the HPF 451 is adjusted.

Thus, according to one or more embodiments of the present example, filter characteristics of the RF circuit 45 are automatically adjusted depending on the presence or absence of the upper limit channels and the lower limit channels, which vary by region, and an interfering wave can be efficiently suppressed.

Fifth Example

Figure 7:
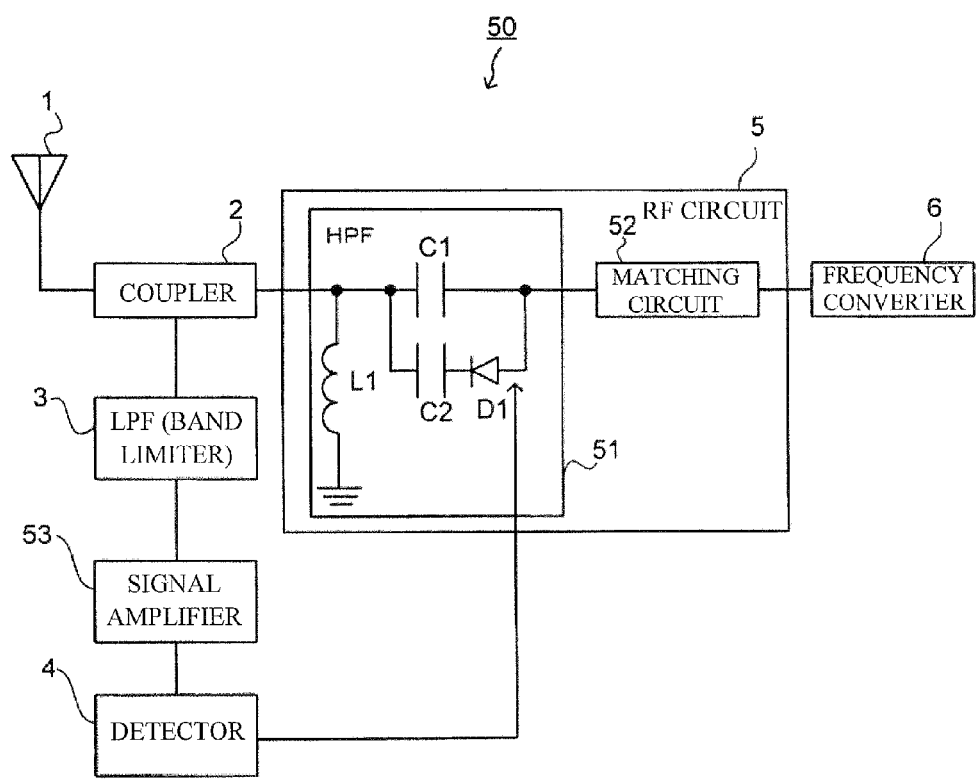
FIG. 7 is a schematic configuration of a high frequency circuit according to one or more embodiments of a fifth example of the present invention.

Next, embodiments of a fifth example of the present invention is described. A schematic configuration of a high frequency circuit according to one or more embodiments of the present example is illustrated in FIG. 7. In a high frequency circuit 50 illustrated in FIG. 7, a configuration is provided by adding a signal amplifier 53 to the configuration in embodiments of the first example of the present invention (FIG. 1), between the LPF 3 and the detector 4.

The signal amplifier 53 amplifies the peak-to-peak level of a signal after band limiting output from the LPF 3, and outputs a signal after amplification to the detector 4. By this, the level of the DC voltage signal as detection results by the detector 4 can be highly adjusted. The capacitor C2 and the PIN diode D1 may function as an adjuster of the RF circuit 51.

According to embodiments of the modified example of the present invention, the signal amplifier 53 may be disposed in a later stage of the detector 4 and the DC voltage output level of the detector 4 may be applied to the PIN diode D1 after amplification.

Sixth Example

Figure 8:
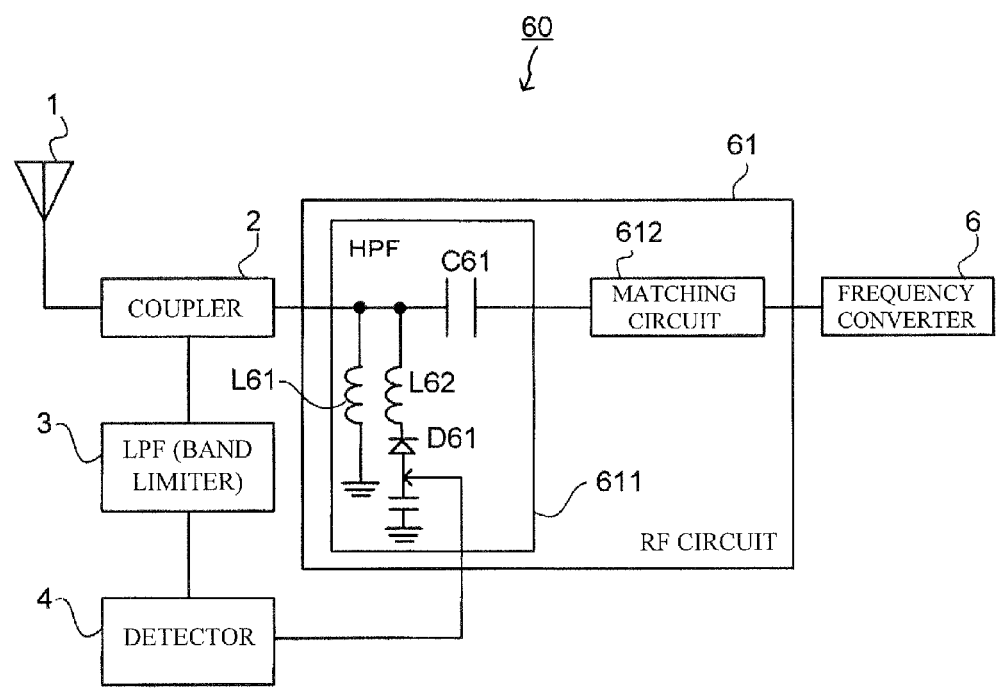
FIG. 8 is a schematic configuration of a high frequency circuit according to one or more embodiments of a sixth example of the present invention.

Next, embodiments of a sixth example of the present invention is described. A schematic configuration of a high frequency circuit according to one or more embodiments of the present example is illustrated in FIG. 8. In a high frequency circuit 60 illustrated in FIG. 8, an RF circuit 61 having an HPF 611 and a matching circuit 612 is provided.

In addition to a capacitor C61 and an inductor L61 connected in series, the HPF 611 has the series connection configuration of a PIN diode D61 and an inductor L62 connected in parallel to the inductor L61.

A DC voltage signal output by the detector 4 is applied to the PIN diode D61. When the DC voltage signal is low level, the inductor L62 does not function and the HPF 611 functions as a circuit composed of an inductor L61 and a capacitor C61 because the PIN diode D61 becomes a nonoperational open state. Further, if the DC voltage signal is at a sufficiently elevated high level, the inductor L61 functions because the PIN diode D61 functions as pure resistance. The HPF 611 may function as an adjuster of the RF circuit 61.

In this way, according to one or more embodiments of the present example, the cutoff frequency is adjusted and the interfering wave can be efficiently suppressed by controlling an inductance component of the HPF 611 according to the reception bands, which vary by region.

Seventh Example

Figure 9:
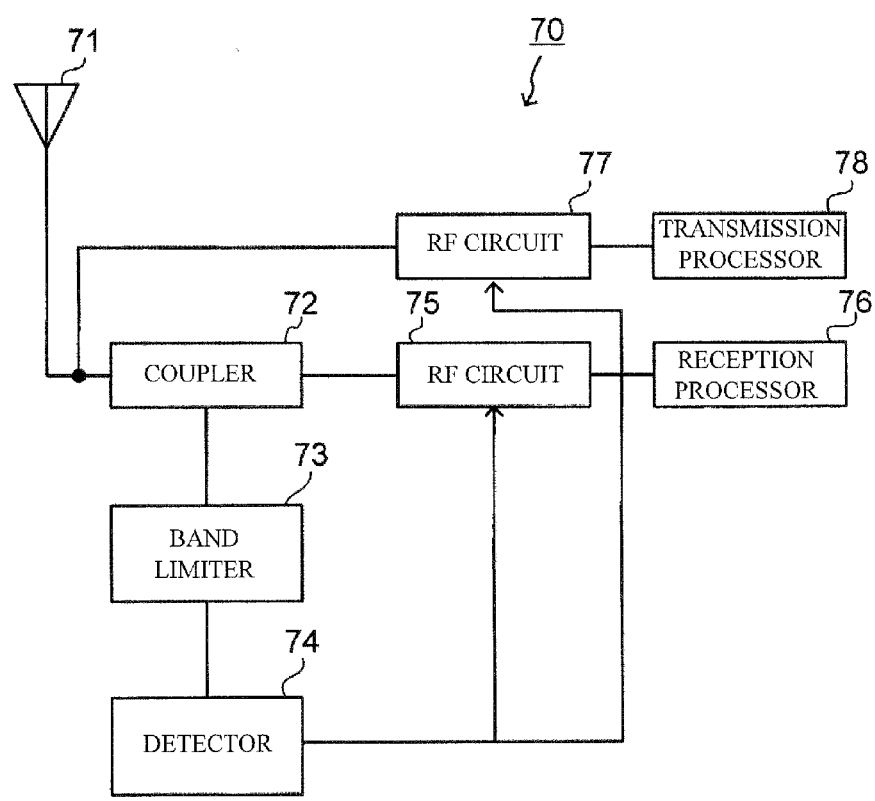
FIG. 9 is a schematic configuration of a high frequency circuit according to one or more embodiments of a seventh example of the present invention.

Next, a schematic configuration of a high frequency circuit 70 according to one or more embodiments of a seventh example of the present invention is illustrated in FIG. 9. The high frequency circuit 70 illustrated in FIG. 9 is a circuit used as a mobile communication terminal for example. The high frequency circuit 70 may comprise an antenna 71, a coupler 72, a band limiter 73, a detector 74, an RF circuit 75, a reception processor 76, an RF circuit 77, and a transmission processor 78. The coupler 72 and the RF circuit 77 are connected to the antenna 71. The RF circuit 77 may function as an adjuster.

Adjustment of a characteristic of the RF circuit 75 for a receiving system based on an output of the detector 74 is the same as the previous embodiment, but by one or more embodiments of the present example, operation in the RF circuit 77 of the transmission system based on an output of the detector 74 is also adjusted.

As a result, transmission processing can be automatically adjusted according to the reception bands, which differ by region.

Figure 10:
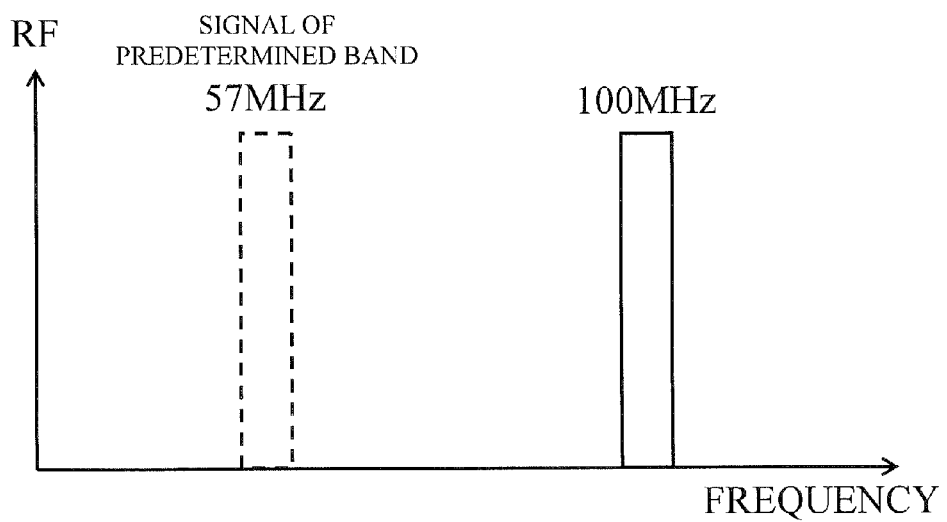
FIG. 10 is a schematic diagram of a signal input to a high frequency circuit according to one or more embodiments of the present invention.
Figure 11:
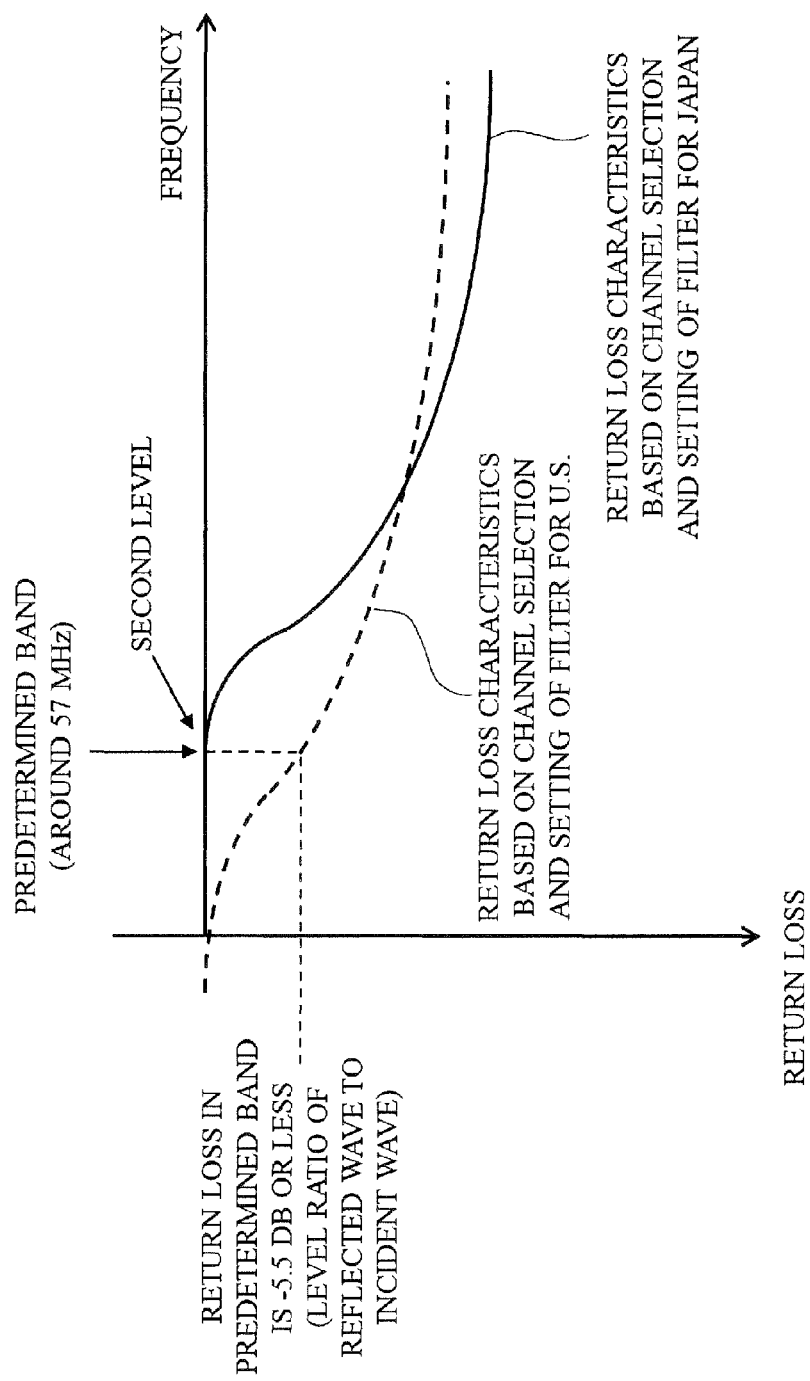
FIG. 11 is a schematic graph illustrating a relationship between a frequency and return-loss in a high frequency circuit according to one or more embodiments of the present invention.

FIG. 10 is a schematic diagram of a signal input to the high frequency circuit 10 according to one or more embodiments of the present invention. As illustrated in FIG. 10, for example, a signal at frequency of 100 MHz is input to the high frequency circuit 10. A signal at around 57 MHz is a signal in the predetermined band of the high-frequency signal input to the high frequency circuit 10. FIG. 11 is a schematic graph illustrating a relationship between a frequency and return-loss in the high frequency circuit 10 according to one or more embodiments of the present invention. As illustrated in FIG. 11, the horizontal axis represents the frequency and the vertical axis represents the return-loss. FIG. 11 shows return-loss characteristics based on each filter setting for Japan and U.S., while selecting the channel at 100 MHz. According to one or more embodiments of the present invention, signals at 57 MHz and 100 MHz are turned ON and OFF, and the return-loss is measured. As illustrated, the characteristic of the matching circuit 52 is adjusted based on the detected level and causes a return-loss in the predetermined band of when signal in the high-frequency signal is input to be smaller than when the signal is not input. Further, the return-loss in the predetermined band is desired to be −5.5 dB or less (level ratio of reflected wave to incident wave) when the signal in the predetermined band of the high-frequency signal is input.

Figure 12:
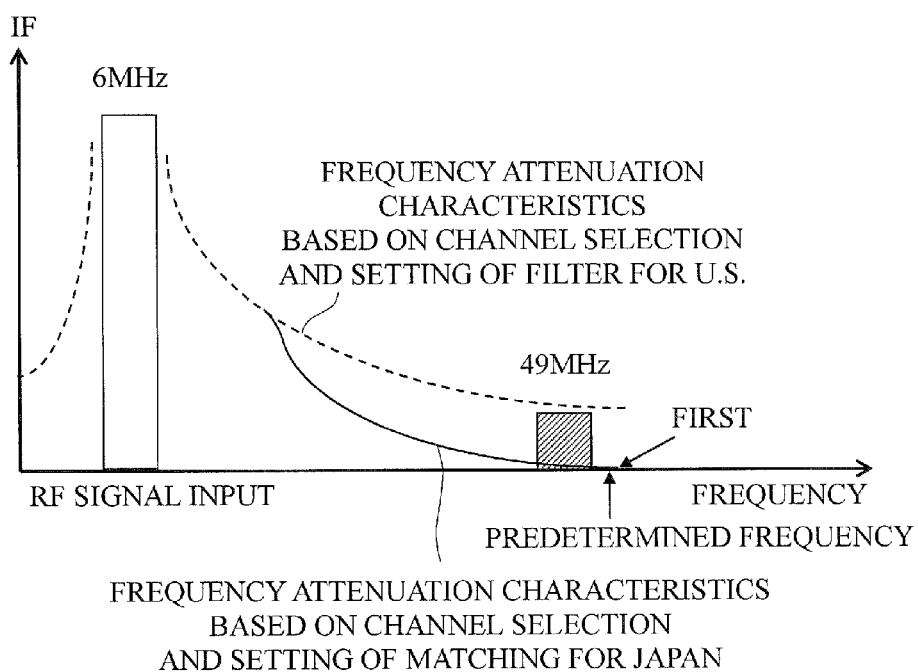
FIG. 12 is a schematic graph illustrating frequency attenuation characteristics in a high frequency circuit according to one or more embodiments of the present invention.

FIG. 12 is a schematic graph illustrating frequency attenuation characteristics in a high frequency circuit according to one or more embodiments of the present invention. As illustrated in FIG. 12, the horizontal axis represents the frequency and the vertical axis represents the signal level at an IF (Intermediate Frequency), which is the converted frequency of the input high frequency signal. For example, the 100 MHz signal is converted to 6 MHz at IF and the 57 MHz signal is converted to 49 MHz. FIG. 12 shows frequency attenuation characteristics based on each filter setting for Japan and U.S. The amplitude of the signal at 49 MHz becomes greater when the signal in the high-frequency signal is input than when the signal is not input.

Embodiments of the present invention have been explained, but they can have various modifications within the scope of the present invention. For example, in the embodiments, digital television broadcast reception in the U.S. and Japan is described as one example, but one that corresponds to a region with a broadcasting signal in both a VHF and a UHF band and a region with only a UHF broadcasting signal, as in the EU region for example, is also acceptable.

Further, the high frequency circuit according the embodiment above may be configured as an integrated circuit (IC).

Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

EXPLANATION OF REFERENCES

1 Antenna
2 Coupler
3 Low pass filter (LPF)
4 Detector
5 RF circuit
6 Frequency converter
51 High pass filter (HPF)
52 Matching circuit
C1, C2 Capacitor
L1 Inductor
D1 PIN diode

What is claimed is:

1. A broadcast receiver comprising;
a filter circuit with an adjustable cutoff frequency and that receives a broadcasting signal;
a detector that detects a level of a signal of a first predetermined band of the broadcasting signal; and
an adjuster that adjusts the cutoff frequency based on the detected level, wherein
when the detected level is less than or equal to a predetermined level, the adjuster adjusts the cutoff frequency to a first cutoff frequency that blocks at least a signal of the first predetermined band.

2. The broadcast receiver according to claim 1, further comprising:
a frequency converter that is connected to the filter circuit and converts a frequency of a signal of the first predetermined band to a predetermined frequency, wherein
when the detector detects the level of the signal of the first predetermined band to be greater than the predetermined level, the adjuster adjusts the cutoff frequency and causes an amplitude of the converted signal to become greater than a first level at or above a frequency of a second predetermined band.

3. The broadcast receiver according to claim 2, wherein the adjuster adjusts the cutoff frequency and causes the amplitude of the converted signal to become greater than an amplitude of the signal of the second predetermined band of when the detector detects the level of the signal of the first predetermined band to be smaller than the predetermined level.

4. The broadcast receiver according to claim 1, further comprising:
a frequency converter that is connected to the filter circuit and converts a frequency of a selected signal to a predetermined frequency, wherein
when a frequency higher than the first predetermined band by a first frequency is selected and when the detector detects the level of the signal of the first predetermined band to be greater than the predetermined level, the adjuster adjusts the cutoff frequency and causes an amplitude of the converted signal to become greater than a first level at or above the frequency higher than a predetermined intermediate frequency by the first frequency.

5. The broadcast receiver according to claim 4, wherein the adjuster adjusts the cutoff frequency and causes the amplitude of the converted signal to become greater than an amplitude of the signal of the predetermined intermediate frequency of when the detector detects the level of the signal of the first predetermined band to be smaller than the predetermined level.

6. The broadcast receiver according to claim 1, further comprising:
a separator that separates the broadcasting signal into a plurality of output signals, wherein the filter circuit processes a first output signal of the plurality of the output signals.

7. The broadcast receiver according to claim 6, further comprising:
a band limiter that limits a band in a predetermined band of a second output signal of the plurality of the output signals, wherein
the detector detects a signal level output by the band limiter after the band limiter limits the band, and
the adjuster adjusts the cutoff frequency based on a detection signal output by the detector.

8. The broadcast receiver according to claim 7, further comprising:
a voltage output controller, wherein
the band limiter and the detector are respectively provided in a plurality, and
the voltage output controller outputs a control signal based on a level corresponding to a combination of the level of each detection signal output by the plurality of detectors.

9. The broadcast receiver according to claim 7, wherein
the band limiter and the detector are respectively provided in a plurality,
the filter circuit includes a plurality of filters, and
each of the plurality of detectors outputs each detection signal to each of the plurality of the filters included in the filter circuit.

10. The broadcast receiver according to claim 7, further comprising:
a signal amplifier that is arranged between an output of the band limiter and an input of the detector.

11. The broadcast receiver according to claim 1, wherein the broadcast receiver is a high frequency circuit, and the filter circuit is an RF circuit.

12. A tuning apparatus comprising;
a filter circuit with an adjustable cutoff frequency and that receives a broadcasting signal;
a detector that detects a level of a signal of a first predetermined band of the broadcasting signal; and
an adjuster that adjusts the cutoff frequency based on the detected level, wherein
when the detected level is less than or equal to a predetermined level, the adjuster adjusts the cutoff frequency to a first cutoff frequency that blocks at least a signal of the first predetermined band.

* * * * *